(12) United States Patent
Fuller et al.

(10) Patent No.: US 11,721,636 B2
(45) Date of Patent: Aug. 8, 2023

(54) CIRCUIT DIE ALIGNMENT TARGET

(71) Applicant: HEWLETT-PACKARD DEVELOPMENT COMPANY, L.P., Spring, TX (US)

(72) Inventors: Anthony M. Fuller, Corvallis, OR (US); Michael W. Cumbie, Corvallis, OR (US); Chien-Hua Chen, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 146 days.

(21) Appl. No.: 16/603,821

(22) PCT Filed: Apr. 15, 2018

(86) PCT No.: PCT/US2018/027690
§ 371 (c)(1),
(2) Date: Oct. 8, 2019

(87) PCT Pub. No.: WO2019/203780
PCT Pub. Date: Oct. 24, 2019

(65) Prior Publication Data
US 2021/0402782 A1    Dec. 30, 2021

(51) Int. Cl.
*H01L 23/544* (2006.01)
*B41J 2/175* (2006.01)
*H01L 21/68* (2006.01)

(52) U.S. Cl.
CPC ........ *H01L 23/544* (2013.01); *B41J 2/17546* (2013.01); *H01L 21/68* (2013.01); *H01L 2223/54426* (2013.01)

(58) Field of Classification Search
CPC .................................................... H01L 23/544
See application file for complete search history.

(56) References Cited

U.S. PATENT DOCUMENTS

| | | |
|---|---|---|
| 4,732,646 A | 3/1988 | Elsner et al. |
| 5,942,805 A | 8/1999 | Winer |
| 5,982,044 A | 11/1999 | Lin |
| 7,084,013 B2 | 8/2006 | Farnworth |
| 2004/0072438 A1 | 4/2004 | Maltabes et al. |
| 2007/0206191 A1 | 9/2007 | Dodd et al. |
| 2009/0325322 A1 | 12/2009 | Patterson |
| 2010/0002051 A1* | 1/2010 | Yoshimura .......... B41J 2/15 347/40 |
| 2010/0225009 A1 | 9/2010 | Lam |
| 2011/0018941 A1 | 1/2011 | McAvoy et al. |
| 2011/0217797 A1 | 9/2011 | Westland |
| 2014/0027861 A1 | 1/2014 | Han |
| 2014/0179103 A1 | 6/2014 | Kang |
| 2015/0108611 A1 | 4/2015 | Kumagai et al. |
| 2015/0287683 A1 | 10/2015 | Moon et al. |
| 2015/0333014 A1 | 11/2015 | Wirz et al. |
| 2016/0013069 A1 | 1/2016 | deVilliers |
| 2016/0221341 A1 | 8/2016 | Chen et al. |
| 2020/0381396 A1* | 12/2020 | Chen .............. H01L 25/0657 |

FOREIGN PATENT DOCUMENTS

WO    WO-2005044573    5/2005

* cited by examiner

*Primary Examiner* — Jae Lee
(74) *Attorney, Agent, or Firm* — Foley & Lardner LLP

(57) ABSTRACT

A circuit die may include an outermost circuit layer having electrical transmission routing and an alignment target overlying the outermost circuit layer.

11 Claims, 8 Drawing Sheets

CIRCUIT DIE ALIGNMENT TARGET

BACKGROUND

Circuit dies are utilized in a wide variety of assemblies. Circuit dies include electrical transmission routings in the form of wires or traces. The electrical transmission routings transmit power or electrical control signals to electrical elements of the circuit die. To assist in aligning such circuit dies to other components in an assembly, many circuit dies additionally include an alignment target at a predefined location. During assembly of the assembly, the alignment target is sensed, optically or otherwise, to identify the positioning and/or orientation of the die, facilitating precise positioning of the circuit die with respect to other components of the assembly.

Figure 1:
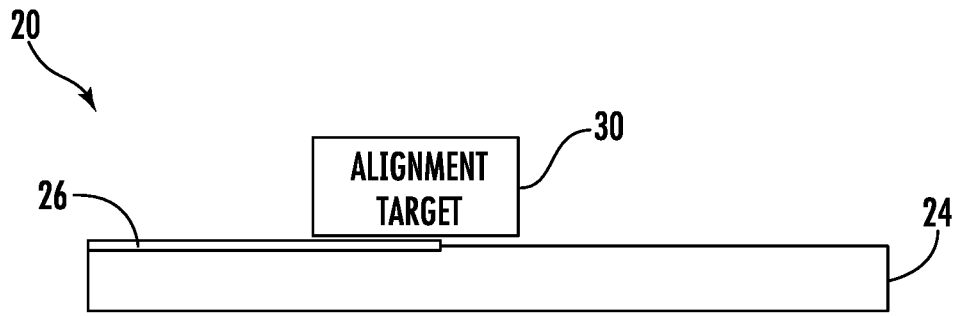
FIG. 1 is a side view schematically illustrating portions of an example circuit die.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION OF EXAMPLES

Disclosed are example circuit dies, circuit die assemblies and methods that comprise or form an alignment target that overlies an outermost circuit layer of the circuit die. In contrast to an alignment target formed in a circuit layer having electrical transmission routings, the disclosed alignment target overlies such circuit layers, reducing or eliminating interference with the layout of such electrical transmission routings. Because the disclosed alignment target does not occupy valuable space within such circuit layers, but instead overlies such circuit layers and their electric transmission routings, the circuit layers may have a higher density of electrical transmission routings, facilitating smaller and more compact circuit dies while maintaining the size of the alignment target for detection.

Examples provided herein may be formed by performing various microfabrication and/or micromachining processes on a substrate to form and/or connect structures and/or components. The substrate may comprise a silicon based wafer or other such similar materials used for microfabricated devices (e.g., glass, gallium arsenide, plastics, etc.). Such structures or components may be formed by performing etching, microfabrication processes (e.g., photolithography), or micromachining processes in a substrate. In some examples described herein, at least one dimension of a structure or component may be of a small size (e.g., of nanometer sized scale, micrometer sized scale, millimeter sized scale, etc.).

Throughout the disclosure, various circuit dies are illustrated and described. In each of the implementations, the individual circuit dies may each comprise a die "sliver". A die "sliver" means a circuit die with a ratio of length to width greater than 50. In some implementations, a die "sliver" means a circuit die with a ratio of length to width of 75 or more. In some implementations, the individual circuit dies may have a ratio of length to width of 50 or less.

Disclosed is an example circuit die assembly that may include a circuit die. The circuit die may include an outermost circuit layer having electrical transmission routing and an alignment target overlying the outermost circuit layer.

Disclosed is an example circuit assembly fabrication method. The method may include forming an alignment target that overlies an outermost circuit layer of a circuit die, sensing light interaction with the alignment target and positioning the die relative to another component of the circuit assembly based upon the sensed light interaction.

Disclosed is an example circuit die. The example circuit die may include a set of layers comprising circuit layers having electrical transmission routings, the set of layers having an outermost circuit layer and a non-circuit layer overlying the set of layers. The non-circuit layer may have a channel having a shape corresponding to a shape of an alignment target.

FIG. 1 schematically illustrates portions of an example circuit die 20. As will be described hereafter, circuit die 20 comprises an alignment target that overlies an outermost circuit layer such that electrical transmission routings may be more compact and the relative size of the alignment target may be maintained for detection. Circuit die 20 may be utilized as part of a larger circuit die assembly having other components that interact with electronic components of circuit die 20 or having other circuit dies that may or may not interact with circuit die 20. Circuit die 20 comprises an outermost circuit layer 24 and alignment target 30.

Outermost circuit layer 24 comprises the outermost circuit layer of die 20 having electrical transmission routings 26. Such electrical transmission routings 26 may be in the form of electrically conductive traces or electrically conductive wires. Such electrical transmission routings 26 may be embedded within layer 24 or secured along a top surface of layer 24. In addition to electrical transmission routings 26, outermost circuit layer 24 may include electronic circuit elements such as resistors, transistors, capacitors, inductors and diodes connected to one another via such electrical transmission routings 26. In one implementation, die 20 may consist of a single layer 24. In another implementation, die 20 may comprise multiple circuit layers similar to layer 24, but where layer 24 is the topmost or bottommost (outermost) layer of a stack of such circuit layers. In one implementation, outermost circuit layer 24 may be formed from silicon. In another implementation, outermost circuit layer 24 may be formed from a circuit board material such as a glass reinforced epoxy laminate material such as FR-4.

Alignment target 30 comprises a layer or structure overlying or formed upon outermost circuit layer 24. In one implementation, alignment target 30 may comprise a single layer of a dielectric material. In another implementation, alignment target 30 may comprise multiple layers of a dielectric material. In one implementation, alignment target 30 does not provide any electrical interactions, not for serving as or as part of an electrical circuit element such as a capacitor, diode or electric resistor (other than being a dielectric material).

In one implementation, alignment target 30 may overlie and be formed of at least partially on top of electrical transmission routings 26 and/or electronic circuit elements. In one implementation, alignment target 30 is formed from a material selected to be sensed by an external sensor, wherein the sensed location of alignment target 30 facilitates precise and location dependent interaction with circuit die 20. In one implementation, alignment target 30 has a shape selected to be sensed by an external sensor, wherein the sensed location of alignment target 30 facilitates precise and location dependent interaction with circuit die 20. In one implementation, the shape of alignment target 30 is distinct from the shape of an electrical transmission routings or electric elements provided in circuit die 20. In one implementation, alignment target 30 may have a shape of a ring, a crisscross shape, a U-shape or combinations thereof. In some implementations, alignment target 30 extends to an edge of die 20. In some implementations, alignment target 30 extends to multiple edges of die 20. In yet other implementations alignment target 30 extends to and from opposite edges of die 20.

In implementations where alignment target 30 is to be optically sensed, alignment target 30 is formed from at least one material that provides alignment target 30 with a sufficient contrast with respect to any surrounding layers or with respect to the underlying outermost circuit layer 24 so as to facilitate detection of the precise location and positioning of alignment target 30. In one implementation, alignment target 30 provides an optical contrast of at least 10% with respect to any adjacent surfaces. In one implementation, alignment target 30 is formed from a single layer of a dielectric material such as an epoxy mold compound, wherein the surrounding materials comprise an epoxy-based negative photoresist such as SU8 and the materials forming circuit layer 24.

In one implementation, alignment target 30 is sufficiently sized for detection by an external sensor. Although the size may be dependent upon performance properties of the external sensor, a larger size alignment target 30 may facilitate enhanced accuracy as well as facilitate the use of existing or less expensive external sensors. In one implementation, alignment target 30 has a surface area of at least 500 um$^2$. in one implementation, alignment target 30 has a length of at least 30 um and/or a width of at least 30 um. In one implementation, outermost circuit layer 24 and die 20 may have a length dimension (shown in FIG. 1) and a smaller width dimension. In such an implementation, alignment target 30 covers at least 50% of the width of die 20. In one implementation, alignment target 30 covers at least 75% of the width of die 20. In one implementation, alignment target 30 has a primary shape, such as a ring, that covers at least 50% of the width of die 20, and at least one extension that extends from the primary shape to at least one edge of die 20.

Figure 2:
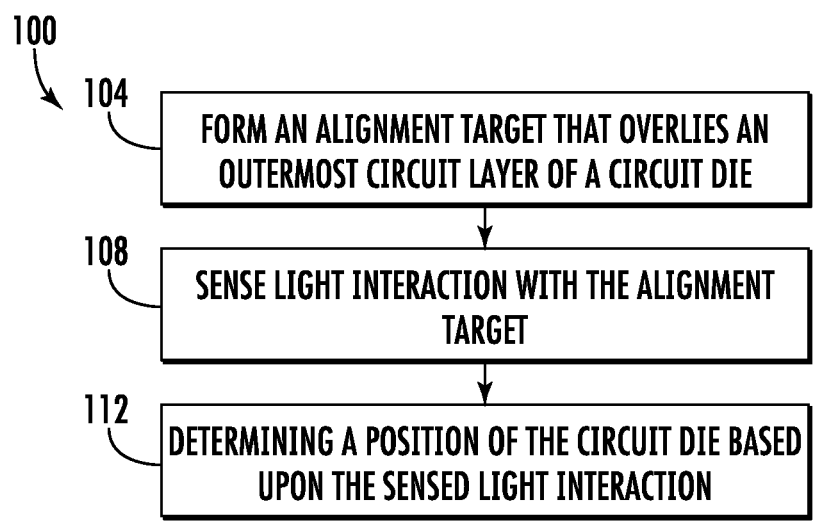
FIG. 2 is a flow diagram of an example circuit assembly fabrication method.

FIG. 2 is a flow diagram of an example circuit assembly fabrication method 100. Method 100 utilizes an alignment target that overlies outermost circuit layer of a circuit die to facilitate controlled interaction with the circuit die during assembly of a circuit die assembly. Method 100 may utilize circuit die 20 described above or any other of the circuit dies described hereafter.

As indicated by block 104, an alignment target, such alignment target 30, is formed. The alignment target overlies an outermost circuit layer, such as layer 24, of a circuit die. As discussed above, the alignment target is formed from at least one material and/or has a predefined shape that facilitates detection or sensing of the alignment target. The alignment target 30 is formed at a predefined and controlled location on the outermost circuit layer such that subsequent detection of the alignment target indicates the position and/or orientation of the circuit die.

As indicated by block 108, an external sensor senses light interaction with the alignment target. In one implementation, infrared light is directed at the circuit die, wherein reflections of the infrared light are sensed to detect the location and/or orientation of alignment target 30. In one implementation, visible light is directed at the circuit die, wherein reflections of the visible light are sensed to detect the location and such orientation of the alignment target. In yet other implementations, other forms electromagnetic radiation may be provided, wherein differences between the interaction of such electromagnetic radiation with respect to the alignment target and adjacent portions of circuit die 24 are sensed and identified.

In one implementation, the shape of alignment target 30 is sensed and identified. In another implementation, boundaries or edges of alignment target 30 are sensed and identified. In one implementation, a light is scanned across the circuit die. In another implementation, directional light is applied across multiple regions of the circuit die.

As indicated by block 112, based upon the sensed light interaction with respect to alignment target 30 and/or with respect to those portions of the die that are not covered by alignment target 30, a controller processing unit determines a position (potentially including its orientation) of the circuit die. This positional information may be used to control interaction with the die during assembly of the die as part of a die assembly or during use of the die, such as when the die comprises a microfluidic die containing biological or chemical samples being analyzed. For example, such positional information may be utilized to control an actuator which positions or moves the circuit die relative to other circuit dies or other components of the assembly. Such positional information may be used to control an actuator which positions or moves the other circuit dies or other components with respect to the circuit die having the alignment target.

Such position information may be used to control the timing at which interaction with the die take place. For example, a circuit die assembly may be carried by a conveyor or other transport, wherein the sensed presence of alignment target 30 may trigger an interaction with the die such as the deposition or spraying of an additional material or sample upon the circuit die, the removal of material or a sample from the circuit die, the heating or cooling of the circuit die and/or the sensing of materials/biological or chemical samples carried by the circuit die.

Figure 3:
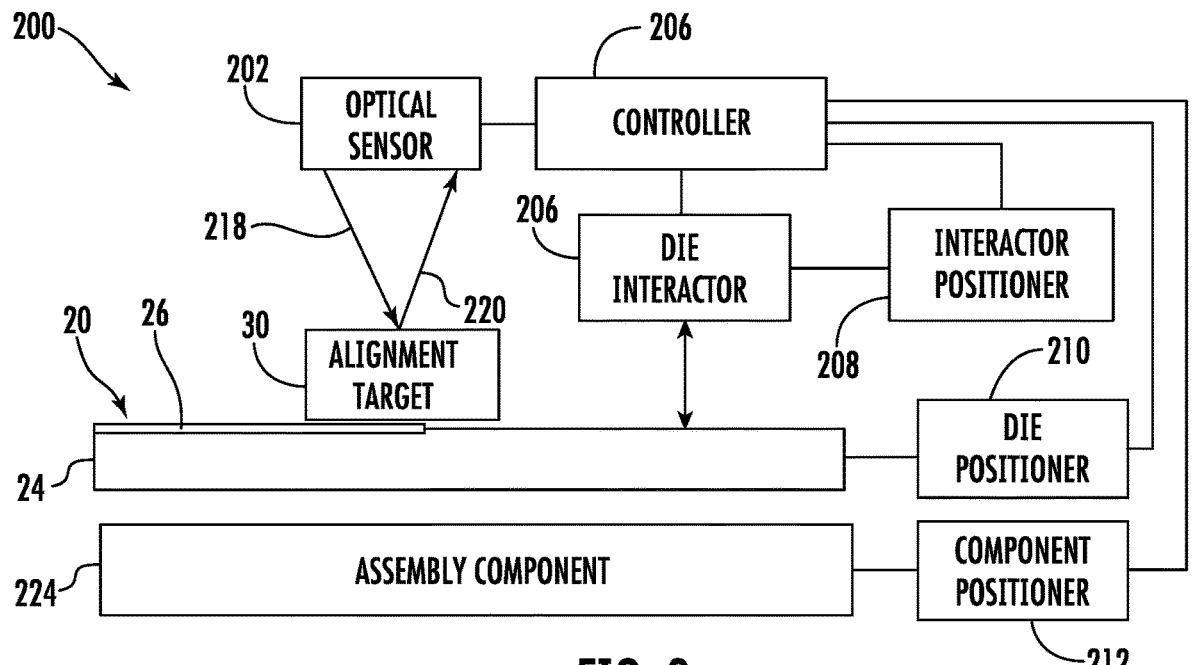
FIG. 3 is a schematic diagram illustrate portions of an example circuit assembly system.

FIG. 3 is a schematic diagram illustrating portions of an example circuit die interaction system 200. System 200 may carry out method 100 described above. System 200 interacts with a circuit die based upon the positioning of the circuit die as determined from the alignment target. Although system 200 is illustrated as interacting with circuit die 20 (described above), it should be appreciated that system 200 may be utilized with any of the circuit dies described hereafter. System 200 comprises optical sensor 202, controller 204, die interactor 206, interactor position or 208, die positioner 210 and component positioner 212.

Optical sensor 202 emits electromagnetic radiation 218 towards circuit die 20, including alignment target 30. In one implementation, optical sensor 202 emits infrared light. In another implementation, sensor 202 emits visible light. Optical sensor 202 further senses or detects interactions of such a light with alignment target 30 and/or portions about alignment target 30 as indicated by arrow 220. In one implementation, a light is scanned across the circuit die. In another implementation, directional light is applied across multiple regions of the circuit die.

Controller 206 is in communication with optical sensor 202, receiving signals from optical sensor 202. Controller 206 comprises a processing unit that follows instructions contained in a non-transitory computer-readable medium. Controller 206 utilizes signals from optical sensor 202 to identify the positioning of alignment target 30 and circuit die 20. In one implementation, the shape of alignment target 30 is sensed and identified. In another implementation, boundaries or edges of alignment target 30 are sensed and identified. Based upon the detected positioning of circuit die 20, controller 206 outputs control signals to control at least one of die interactor 206, interactor position 208, die positioner 210 and component positioner 212.

Die interactor 206 comprises a device that interacts with die 20. In one implementation, die interactor 206 deposits a material which builds upon the existing structure of circuit die 20. In another implementation, die interactor 206 removes a material as part of the completion of die assembly 20. In another implementation, die interactor 206 applies heat or cold to circuit die 20. In yet another implementation, die interactor 206 injects a material or sample (biological or chemical) onto die for treatment or removes a material or sample that has been treated/analyzed by circuit die 20. In some implementations, die interactor 206 senses an existing state, material or sample of circuit die 20. In one implementation, controller 206 controls the timing at which die interactor 206 interacts with circuit die 20 based upon the detected positioning of circuit die 20.

Interactor positioner 208 comprises a powered actuator, such as an electric powered actuator that repositions die interactor 206 relative to circuit die 20. For example, in one implementation, interactor positioner 208 may comprise a cylinder-piston assembly, electric solenoid, electric motor and various transmission elements which move die interactor 206 relative to circuit die 20. Controller 206 may output control signals causing interactor positioner 208 to selectively position die interactor 206 at different positions based upon the detected positioning of circuit die 20.

Die positioner 210 comprises a device that repositions circuit die 20. In one implementation, die positioner 208 may comprise a robotic pick and place device. In another implementation, die positioner 208 may comprise a conveyor. In yet other implementations, die positioner 210 may comprise other devices that move or position circuit die 20. Controller 206 may output control signals causing die positioner 210 to selectively position die 20 at different positions based at least in part upon the detected positioning of circuit die 20.

Component positioner 212 comprises a device that repositions an assembly component 224 relative to circuit die 20. In one implementation, component positioner 212 may comprise a robotic pick and place device. In another implementation, component positioner 212 may comprise a conveyor. In yet other implementations, component positioner 212 may comprise other devices that move or position the assembly component. Controller 206 may output control signals causing die positioner 210 to selectively position die 20 at different positions based at least in part upon the detected positioning of circuit die 20.

In some implementations, die positioner 210 and component positioner 212 may act in concert, moving each of circuit die 20 and assembly component 224 based upon the sensed positioning of circuit die 20 as well as based upon the sensed positioning of assembly component 224. In some implementations, system 200 may omit at least one of die interactor 206, interactor positioner 208, die positioner 210 and component positioner 212.

Figure 4:
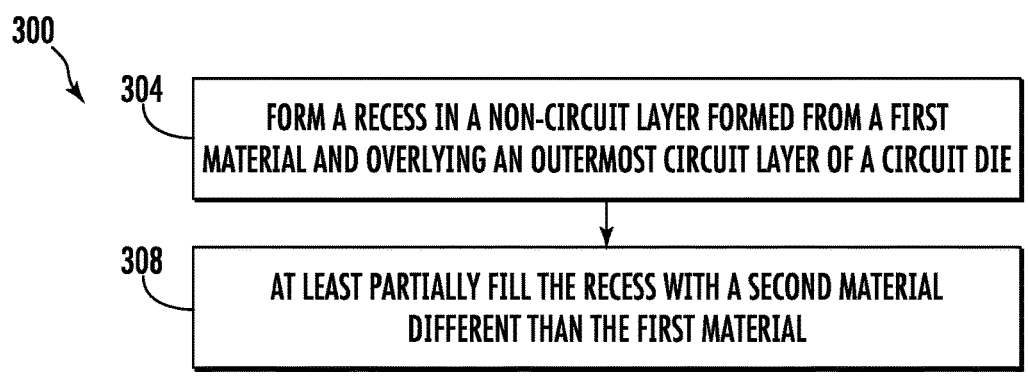
FIG. 4 is a flow diagram of an example method for forming an alignment target on a circuit die.

FIG. 4 is a flow diagram of an example method 300 for forming or otherwise providing an alignment target, such as alignment target 30. As indicated by block 304, a recess is formed in a non-circuit layer formed from a first material and overlying an outermost circuit layer of a circuit die. For purposes of this disclosure, a "non-circuit layer" is a layer that omits electric conductive elements such as resistors, transistors, capacitors, inductors and diodes and one that omits electrical transmission routings. In one implementation, the non-circuit layer is a layer which forms nozzle openings, chambers or flow passages.

In one implementation, the recess formed in the non-circuit layer extends from at least one edge of the circuit die. In one implementation, the recess has a first mouth adjacent and along a first edge and a second mouth adjacent an along a second different edge. In one implementation, the recess has a first mouth adjacent a first edge and a second mouth adjacent a second opposite edge. In one implementation, the recess has a width of at least 4 um. In one implementation, the recess extends across at least 50% of a width of the circuit die, the width being the shorter dimension of the die. In one implementation, the recess extends in the shape of an X. in another implementation, the recess extends in the shape of a ring. In still other implementations, the recess may have other shapes such as a U-shape.

In one implementation, the recess is formed by selectively removing portions of the non-circuit layer. In another implementation, the recess is formed by patterning the non-circuit layer, such as through photolithography.

As indicated by block 308, the recess is at least partially filled with a second material different than the first material. In one implementation, the material filling the recess has different visual characteristics so as to have a visible contrast with respect to the first material. In one implementation, the visible contrast is a contrast of at least 10%. In one implementation, the first material comprises an epoxy-based negative photoresist such as SU8 while the second material comprises an epoxy mold compound. In one implementation, the second material is supplied in a liquid state such that the second material has a viscosity permitting the second material to flow into the recess, and in some implementations, through and across the recess. Once the recess has been sufficiently filled with the second material, the second material may be solidified such as through evaporation or curing. In other implementations, the second material may be jetted or otherwise deposited into the recess from above the recess. In one implementation, the second material completely fills the recess and is flush with the surface of the non-circuit layer. In other implementations of the second material partially fills the recess, leaving a depressed region above the second material.

Figure 5:
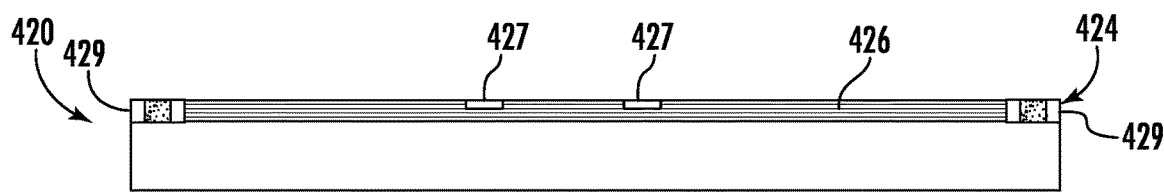
FIG. 5 is a sectional view of portions of an example circuit die.
Figure 6:
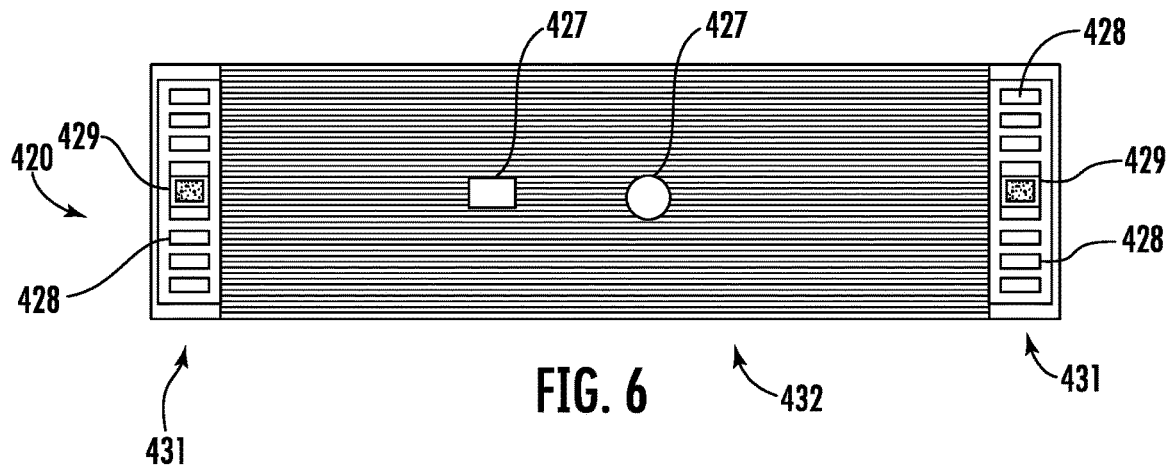
FIG. 6 is a top view of portions of the example circuit die of Figure numeral five.

FIGS. 5-8 illustrate an example circuit die being provided with alignment targets in accordance with the method 300. FIGS. 5 and 6 illustrate an example circuit die 420 prior to the formation of example alignment targets. As shown by FIGS. 5 and 6, circuit die 420 comprises an outermost circuit layer 424 having electrical transmission routings 426, circuit elements 427, electrical contact pads 428 and alignment targets 429. Electrical transmission routings 426 are similar to electrical transmission routings 26 described above. Circuit elements 427 may comprise any of a variety of elements such as resistors, transistors, capacitors, inductors and diodes. Although die 420 is illustrated as comprising two different elements 427, in other implementations, die 420 may comprise the same circuit elements, a single circuit element or more than two circuit elements.

Electrical contact pads 428 facilitates electrical communication in the transmission of power with respect to electrical transmission routings 426 and circuit elements 427. In the example illustrated, electrical contact pads 428 are located on opposite axial ends of circuit 420 and arrange in in parallel with one another with respect to the axial ends. In other implementations, electrical contact pads 428 may be arranged in a row or in series with one another with respect to the axial ends. Regions of die 420 including contact pads 428 generally have a lower density of electrical transmission routings as compared to those portions of circuit die 420 between the axial ends and between the contact pad regions of die 420.

Alignment targets 429 each comprise a shaped mass of material selected to be sensed by an external sensor formed in and as part of layer 424, wherein the sensed location of alignment target 429 facilitates precise and location dependent interaction with circuit die 20. To reduce interference with electrical transmission routings 426 and their layout, alignment targets 429 are formed in contact pad regions 431 of circuit die 420, outside of transmission routing region 432. In some implementations, alignment targets 429 may be covered and concealed with an in capsule it once a let go contacts or connections have been made with electrical contact pads 428.

In one implementation, alignment targets 429 have shapes that optically distinguishable from surrounding structures an external sensor, wherein the sensed location of alignment target 429 facilitates precise and location dependent interaction with circuit die 420. In one implementation, the shape of alignment target 429 is distinct from the shape of an electrical transmission routings or electric elements provided in circuit die 20. In one implementation, alignment target 429 may have a shape of a ring, a crisscross (X) shape, a U-shape or combinations thereof.

In implementations where alignment target 429 is to be optically sensed, alignment target 429 is formed from at least one material that provides alignment target 429 with a sufficient contrast with respect to any surrounding portions of layer 424 so as to facilitate detection of the precise location and positioning of alignment target 429. In one implementation, alignment target 429 provides an optical contrast of at least 10% with respect to any adjacent surfaces. In other implementations, alignment target 429 may provide a lower degree of optical contrast depended upon capabilities of sensors that sense the optical contrast.

In one implementation, alignment target 429 is sufficiently sized for detection by an external sensor. Although the size may be dependent upon performance properties of the external sensor, a larger sized alignment target 429 may facilitate enhanced accuracy as well as facilitate the use of existing or less expensive external sensors.

Figure 7:
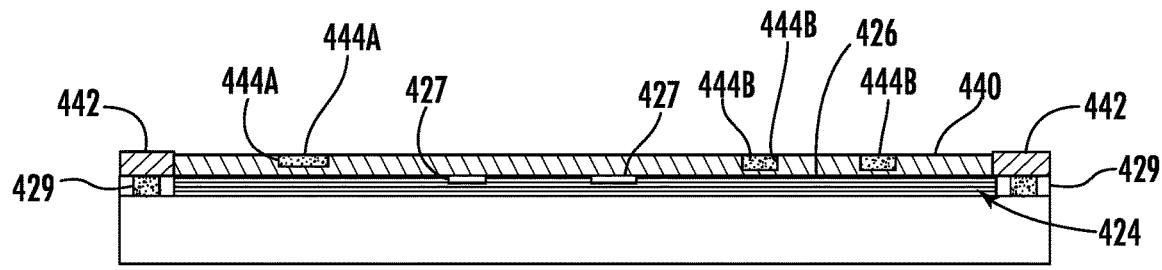
FIG. 7 is a sectional view of the circuit die of FIG. 5 additionally provided with alignment targets.
Figure 8:
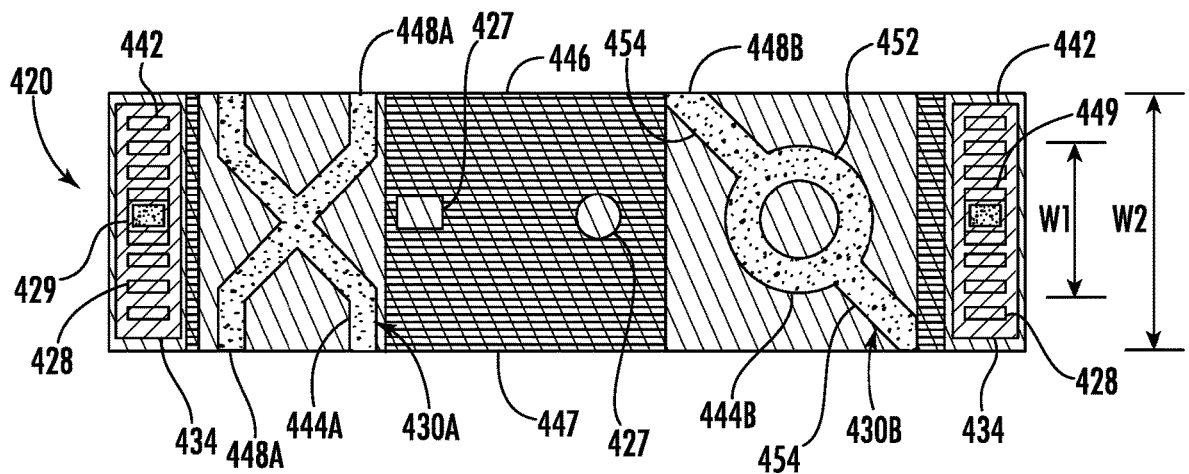
FIG. 8 is a top view of the circuit die of FIG. 7.

FIGS. 7 and 8 illustrate circuit die 420 following the formation of alignment targets 430A, 430B (collectively referred to as targets 430) and following the deposition of an end cap material 434 over electrical contact pads 428 and alignment targets 429. As discussed above in block 304 of method 300, a non-circuit layer 440 is formed over top of at least transmission routing region 432 and circuit elements 427. In the example illustrated, dielectric encapsulant 442 is deposited over electrical contact pad regions 431. In addition, recesses 444A and 444B (collectively referred to as recesses 444) are formed in non-circuit layer 440. In the example illustrated, recess 444A extends partially through layer 440 while recess 444B extends completely through layer 440. In other implementations, each of such recesses 444 may extend completely through or partially through layer 440. In some implementations, recess 444 may be formed on an underside of layer 440, where layer 440 is formed from a transparent or translucent material. In one implementation, recesses 444 are formed by selectively removing portions of the non-circuit layer 440. In another implementation, the recesses 444 are formed by patterning the non-circuit layer 440, such as through photolithography.

As further shown by FIGS. 7 and 8, recess 444A has a crisscross or X shape, extending from the first edge 446 to a second opposite edge 447. The recess 444A further comprises two mouths on edge 446 and two mouths 447. Recess 444B is in the shape of a ring 452, having a pair of extensions 454 extending from the opposite edges 446 and 447. In such an implementation, the ring 452 has a width W1 of at least 50%, and nominally of at least 75%, of the width W2 of circuit die 420. In the example illustrated, such extensions are oblique relative to edges 446 and 447. In other implementations, such extensions may be perpendicular to edges 446, 447. In yet other implementations, recesses 444 may have other shapes.

As indicated by block 308 of method 300, the recesses 444 are filled with materials 448A, 448B (collectively referred to as materials 448. Such materials are distinct from the materials forming the surrounding portions of layer 440 so as to provide a visibly discernible contrast with respect to such portions. In one implementation, the materials provide alignment targets 430 with a contrast of at least 10%. In one implementation, materials 448 are each the same material, formed from an epoxy mold compound while layer 440 is formed from SU8. In some implementations, material 448A is distinct from material 448B to further the distinguish alignment target 444A from alignment target 444B.

In one implementation, the materials 448 are supplied in a liquid state such that the materials 448 have a viscosity permitting the materials 448 to flow into the recesses 444, through and across the recesses 444. Once the recesses have been sufficiently filled with materials 448, the materials 448 be solidified such as through evaporation or curing. In other implementations, the materials 448 may be jetted or otherwise deposited into the recesses 444 from above the recesses 444. In one implementation, materials 448 completely fill the recesses 444, flush with the surface of the non-circuit layer 440. In other implementations of materials 448 partially fill the recesses 444, leaving a depressed region above the materials 448.

Figure 9:
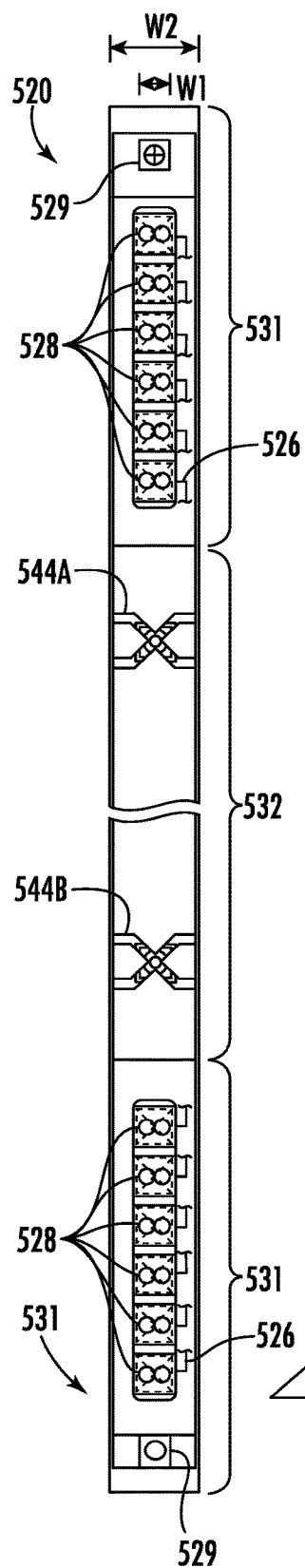
FIG. 9 is a top view of an example circuit die.
Figure 10:
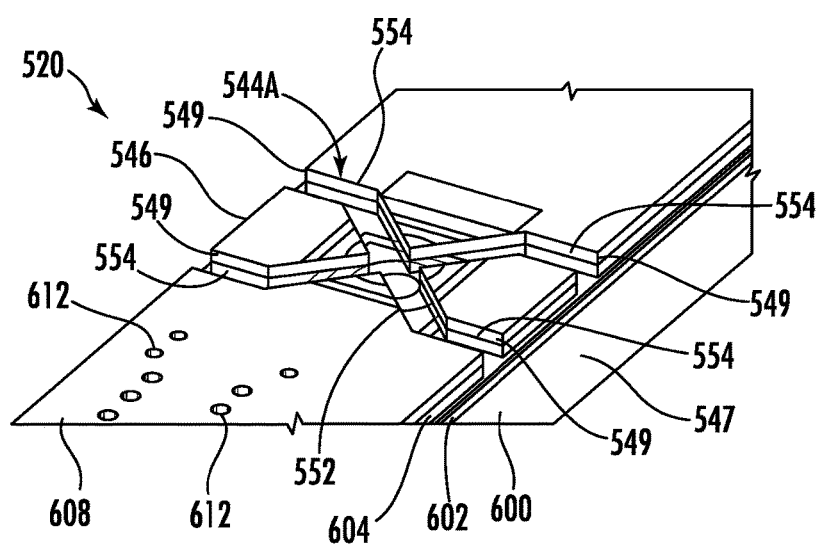
FIG. 10 is a fragmentary enlarged perspective view of a portion of the circuit die of FIG. 9.

FIGS. 9 and 10 illustrate an example circuit die 520 following the forming of recesses that are to outline or define the shape of an alignment target, but prior to the filling of such recesses to complete the alignment target. In the example illustrated, circuit die 520 is to form a fluid ejection device for selectively ejecting droplets of fluid through nozzle orifices. Circuit die 520 comprises substrate 600, thin-film circuit layer 602, non-circuit chamber layer 606, non-circuit orifice layer 608, electrical contact pads 528, alignment targets 529 and alignment target defining recesses 544A, 544B (collectively referred to as recesses 544).

Substrate 600 supports remaining structures of circuit die 520. Some example substrates may include silicon based substrates, glass based substrates, gallium arsenide based substrates, and/or other such suitable types of substrates for microfabricated devices and structures. In the example illustrated, support 600 includes passages in the form of slots or supply feed holes (shown in FIGS. 12 and 13) through which fluid may be supplied to fluid actuators for controlled ejection.

Thin-film circuit layer 602 comprises an outermost circuit layer formed upon substrate 600 which provides circuit elements and transmission routings. In the example illustrated, thin-film circuit layer 602 comprises circuit elements that form fluid actuators that are used to eject fluid through corresponding nozzle orifices. The fluid actuators may include a piezoelectric membrane based actuator, a thermal resistor based actuator, an electrostatic membrane actuator, a mechanical/impact driven membrane actuator, a magnetostrictive drive actuator, or other such elements that may cause displacement of fluid responsive to electrical actuation. In the example illustrated, fluid actuators are thermal resistor based actuators. Thin-film circuit layer 602 may additionally comprise other circuit elements such as transistors and the like for controllable actuation of the fluid actuators.

Non-circuit chamber layer 604, sometimes referred to as a barrier layer, comprise a layer of dielectric material that forms or defines fluidic chambers which contain the fluid actuator. Non-circuit layer 608 overlies non-circuit chamber layer 604 and comprises fluid ejector nozzle orifices 612. In one implementation, layer 604 and 608 are formed from SUB. In yet other implementations, layer 604 608 may be form from other materials.

As shown by FIG. 9, electrical contact pads 528 are located on opposite axial ends of circuit die 520. Due to the width of circuit die 528, electrical contact pads 528 are arranged in a serial fashion along the axis of circuit die 520. Electrical contact pad 528 comprise pads of electrically conductive material which are electrically connected to electrical transmission routings 526, portions of which are shown. Electrical contact pads 528 extend from outermost circuit layer 602 and remain exposed through layers 604 and 608, not covered by layer 604 or 608. Although circuit die 520 is illustrated as comprising six electrical contact pads, in other implementations, circuit die 520 may comprise a greater or fewer of such pads.

Alignment targets 529 are similar to alignment targets 429 described above. Alignment targets 529 have a shape distinguishable from surrounding structures by an external sensor, wherein the sensed location of alignment target 529 facilitates precise positioning and/or location-dependent interaction with circuit die 520. In one implementation, the shape of alignment target 529 is distinct from the shape of an electrical transmission routings or electric elements provided in circuit die 520. In one implementation, alignment target 529 may have a shape of a ring, a crisscross shape, a U-shape or combinations thereof.

In implementations where alignment target 529 is to be optically sensed, alignment target 529 is formed from at least one material that provides alignment target 529 with a sufficient contrast with respect to any surrounding portions of layer 424 so as to facilitate detection of the precise location and positioning of alignment target 529. In one implementation, alignment target 529 provides an optical contrast of at least 10% with respect to any adjacent surfaces. In one implementation, alignment target 529 is sufficiently sized for detection by an external sensor. Although the size may be dependent upon performance properties of the external sensor, a larger size alignment target 529 may facilitate enhanced accuracy as well as facilitate the use of existing or less expensive external sensors.

Alignment targets 529 are formed in circuit layer 602 proximate the opposite axial ends of circuit die 520, adjacent to those regions of die 520 having electrical contact pads 528. In the example illustrated, alignment targets 529 are on an opposite side of electrical contact pads 528 as fluid ejection orifices 612, the fluid actuators associated with such fluid ejection orifices 612 and recesses 544. Because alignment target 529 are formed in contact pad regions 531 of circuit die 520, outside of transmission routing region 532, alignment target 529 does not substantially interfere with the layout of transmission routings 526 and/or the circuit elements, such as the fluid actuators. In some implementations, alignment targets 529 may be covered and concealed with an encapsulant once the electrical contacts or connections have been made with electrical contact pads 428.

Alignment target defining recesses 544 are formed in at least one non-circuit layer so as to overlie circuit layer 602. Alignment target defining recesses 544 are located so as to overlie transmission routing region 532 of the outermost circuit layer 602. In the example illustrated, recesses 544 extend completely through layers 604 and 608 such that the material substrate filling such recesses may contact and adhere to circuit layer 602. In other implementations, each of such recesses 544 may extend partially through layers 604 are partially extend through layer 608. In one implementation, alignment target defining recesses 544 each have a depth of at least 4 um. In one implementation, recesses 544 are formed by selectively removing portions of the non-circuit layer 604 and 608. In another implementation, the recesses 544 are formed by patterning the non-non-circuit layer 604, 608, such as through photolithography.

In the example illustrated, each of recesses 544 has a crisscross or X shape, extending from the first edge 546 to a second opposite edge 547. In the example illustrated, the formed X 552 has a width W1 that is at least 50% of the width W2 of circuit die 520. Although circuit die 520 may have a relatively narrow width, the width or size of recess 546 (and the size of the subsequently completed alignment target) is relatively large facility more accurate detection or the use of less expensive external sensing devices. In one implementation, circuit die 520 has a width W2 of less than or equal to 500 um. The formed X's further comprise recess extensions 554 extending to mouths 549 along the edges 546 and 547 of circuit die 520.

Figure 11:
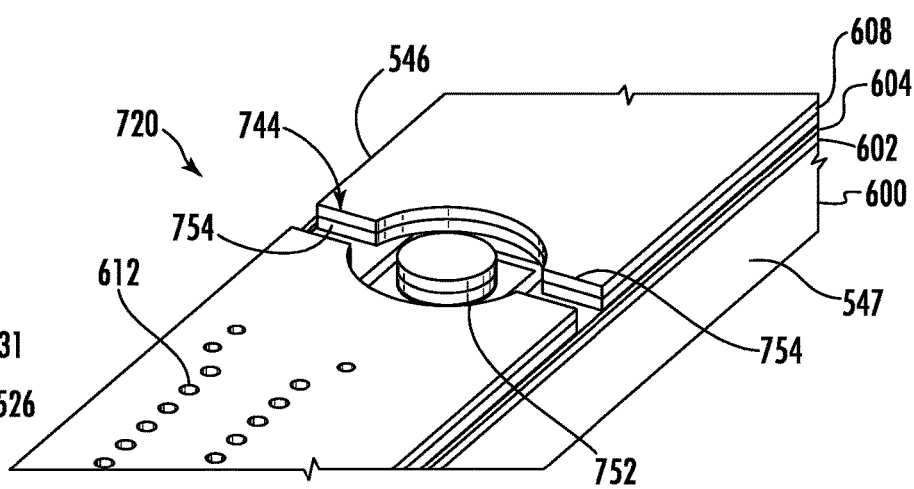
FIG. 11 is a fragmentary enlarged perspective view of a portion of an example circuit die.

FIG. 11 illustrates circuit die 720. Circuit die 720 is similar to circuit die 520 except that circuit die 720 comprises recess 744 in place of recess 544B shown in FIG. 9. Those remaining components of circuit die 720 which correspond to components of circuit die 520 are numbered similarly or are shown in FIGS. 9 and 10. Recess 744 is similar to recess 544B except that recess 744 is in the shape of a ring 752 and comprises extensions 754 extending from the ring to the opposite edges 546 and 547 of circuit die 520. In such an implementation, the ring 752 has a width W of at least 50%, and nominally of at least 75%, of the width W2 of circuit die 720. In the example illustrated, extensions 754 are perpendicular to edges 546 and 547. In other implementations, such extensions 754 may be angled or oblique with respect to edges 546, 547. In yet other implementations, recess 744 may have other shapes.

Figure 12:
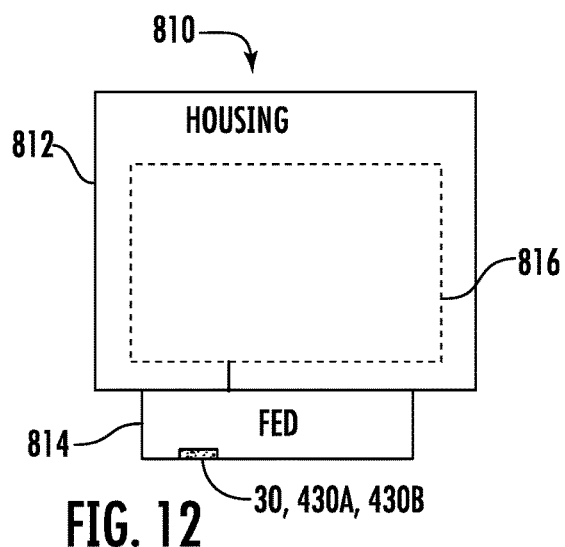
FIG. 12 schematically diagram of portions of an example fluid cartridge.

FIG. 12 schematically illustrates an example fluid cartridge 810 which utilizes the above described alignment targets to facilitate assembly of the fluid cartridge. Fluid cartridge 810 comprises housing 812 and fluid ejection device (FED) 814. Housing 812 comprise a structure to which fluid ejection device 814 is coupled. As shown by broken lines, in one implementation, housing 812 may comprise an internal reservoir 816 fluidly coupled to fluid ejection device 814 for supplying a fluid to be ejected by fluid ejection device 814.

For purposes of this disclosure, the term "coupled" shall mean the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. The term "fluidly coupled" shall mean that two or more fluid transmitting volumes are connected directly to one another or are connected to one another by intermediate volumes or spaces such that fluid may flow from one volume into the other volume.

Fluid ejection device 814 controllably ejects fluid orifices. Fluid ejection device 814 may comprise fluid actuators that displace fluid through such fluid orifices. Examples of such fluid actuators include, but are not limited to, a piezoelectric membrane-based actuator, a thermal resistor-based actuator, an electrostatic membrane actuator, a mechanical/impact driven membrane actuator, a magneto-strictive drive actuator, or other such elements that may cause displacement of fluid responsive to electrical actuation. Fluid ejection device 814 comprises at least one alignment target 30, 430A or 4306 as described above. In one implementation, fluid ejection device 814 comprises circuit die 520 or circuit die 720 as described above.

Figure 13:
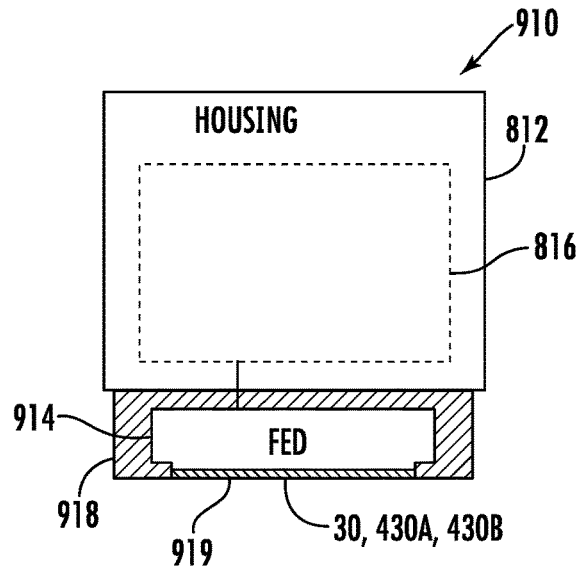
FIG. 13 is a sectional view of portions of an example fluid cartridge.

FIG. 13 is a sectional view of an example fluid cartridge 910. Fluid cartridge 910 is similar to fluid cartridge 810 in that fluid cartridge 910 comprises housing 812 providing a reservoir 816 which is fluidly coupled to a fluid ejection device 914 (each of which is schematically illustrated). In the example illustrated, fluid cartridge 910 additionally comprises a molding 918 that is coupled to housing 812 and that at least partially encapsulates fluid ejection device 914. In the example illustrated, molding 918 at least partially extends on each of sides or faces of fluid ejection device 914. In the example illustrated, molding 918 is flush with a lower face of fluid ejection device 914, the face through which fluid is ejected through orifices.

In the example illustrated, molding 918 comprises a material that is multiple or that is in a somewhat conformable or liquid state during encapsulation of fluid ejection device 914. In one implementation, the fill material forming molding 918 may comprise an epoxy mold compound. As further shown by FIG. 13, the fill material forming molding 918 further extends within recess 919 formed within a lower face of fluid ejection device 914 to form the alignment target 30, 430A, 430B. The fill material provides an optical contrast with respect to the surrounding portions of molding 918 and fluid ejection device 914.

Figure 14:
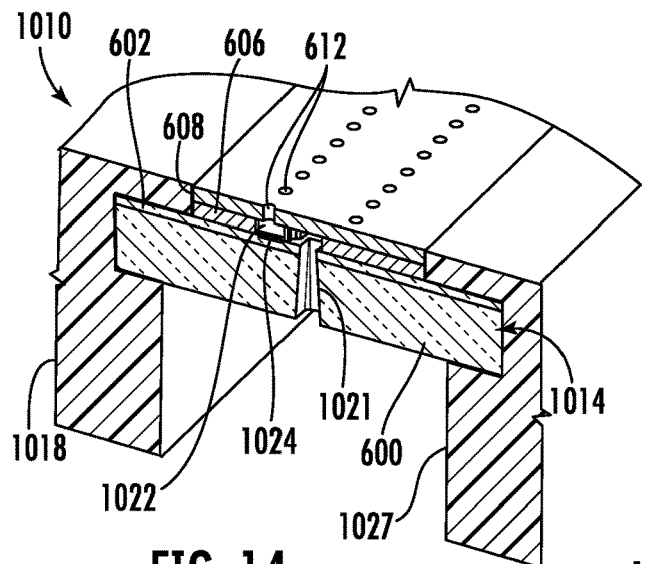
FIG. 14 is a sectional view of portions of an example fluid cartridge.
Figure 15:
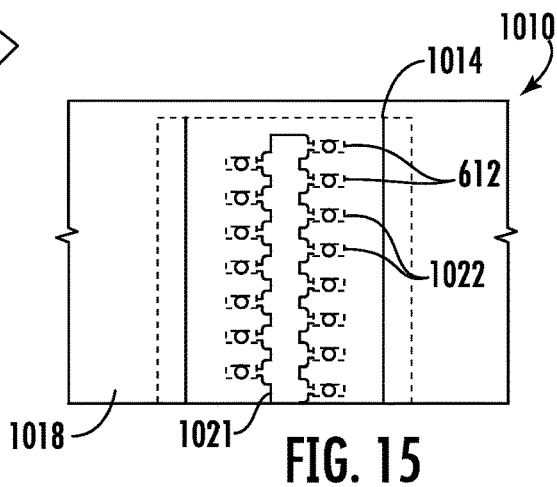
FIG. 15 is a bottom view of portions of the example fluid cartridge of FIG. 14.
Figure 16:
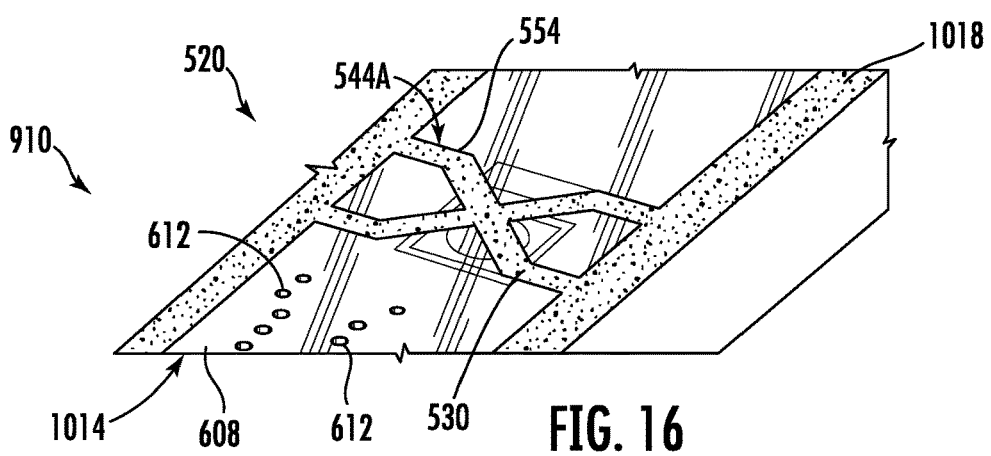
FIG. 16 is a fragmentary perspective view of bottom portions of the example fluid cartridge of FIG. 14.

FIGS. 14-16 illustrate portions of an example fluid cartridge 1010. Fluid cartridge 1010 comprises housing 812 and reservoir 816 (shown in FIG. 13. Fluid cartridge 1010 further comprises fluid ejection device 1014 and molding 1018. In the example illustrated, fluid ejection device 1014 is similar to circuit die 520 described above. Fluid ejection device 1014 comprises substrate 600, thin-film circuit layer 602, non-circuit chamber layer 606, non-circuit orifice layer 608, electrical contact pads 528 (shown in FIG. 9), an alignment target 530 (shown in FIG. 16). Substrate 600, thin-film circuit layer 602, non-circuit chamber layer 606, non-circuit orifice layer 608 and electoral contact pads 528 are described above respect to circuit die 520. Thin-film circuit layer 602 may comprise complex integrated circuit (IC) structure formed on a silicon substrate 600 with layers and elements not shown in FIG. 14.

As further shown by FIG. 14, substrate 600 may comprise a fluid passage 1021 that extends through substrate 600 and is fluidly coupled to a fluid ejection chamber 1022. Thin-film circuit layer 602 forms a fluid actuator 1024 for displacing fluid within an adjacent ejection chamber 1022 (formed by non-circuit chamber layer 606) through a corresponding nozzle or orifice 612. In the example illustrated, fluid actuator 1024 comprises a thermal resistive fluid actuator which heats adjacent fluid to form a bubble that expels fluid through the associated orifice 612. In other implementations, fluid actuator 1024 may comprise another type of fluid actuator. As shown by FIG. 15, fluid ejection chambers 1022 may extend on opposite sides of fluid passage 1021 and may be staggered relative to one another, wherein each chamber 1022 comprises an associated fluid actuator 1024 (shown in FIG. 14).

Molding 1018 is similar to molding 918 described above. In one implementation molding 1018 comprises an epoxy mold compound. As shown by FIGS. 14 and 16, molding 1018 at least partially encapsulates fluid ejection device 1014. A fluid fill passenger feed slot 1027 is formed through molding 1018 to supply fluid to fluid passage 1021.

In the example illustrated, molding 1018 at least partially extends on each of sides or faces of fluid ejection device 1014. In the example illustrated, molding 1018 is flush with a lower face of fluid ejection device 1014, the face through which fluid is ejected through orifices. As shown by FIG. 16, molding 1018 further extends across and at least partially fills recess 554 formed in layer 608 to form alignment target 530. As should be appreciated, the recess 554 may have other shapes, forming differently shaped alignment targets.

Figure 17:
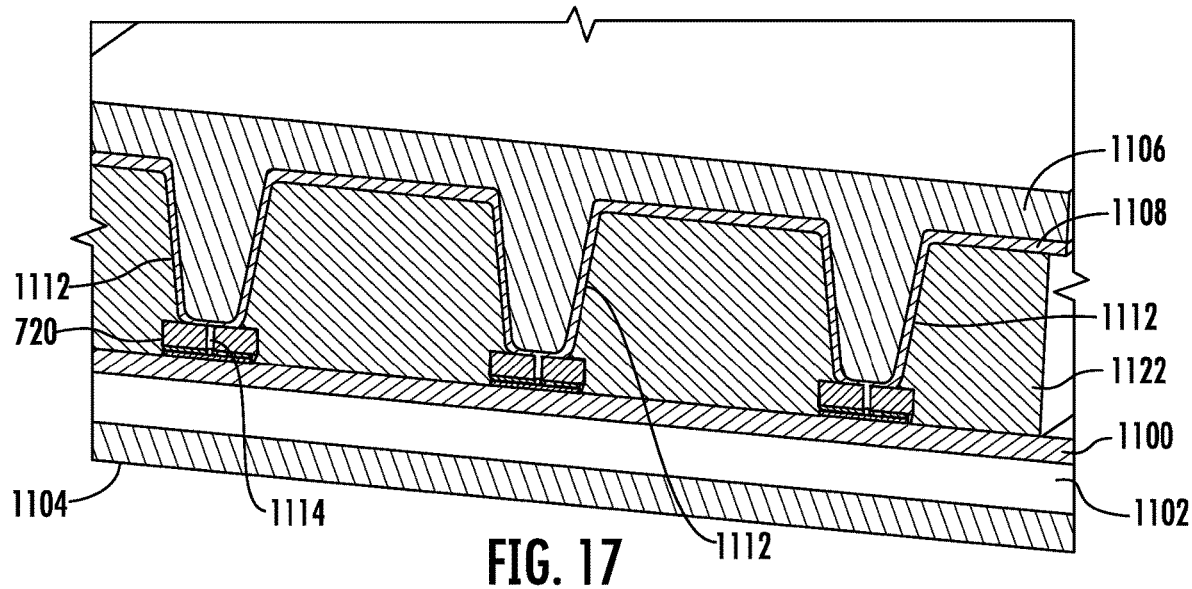
FIG. 17 is a sectional view illustrating circuit dies of FIG. 10 in a mold during partial encapsulation of the circuit dies to form a multi-circuit die unit.
Figure 18:
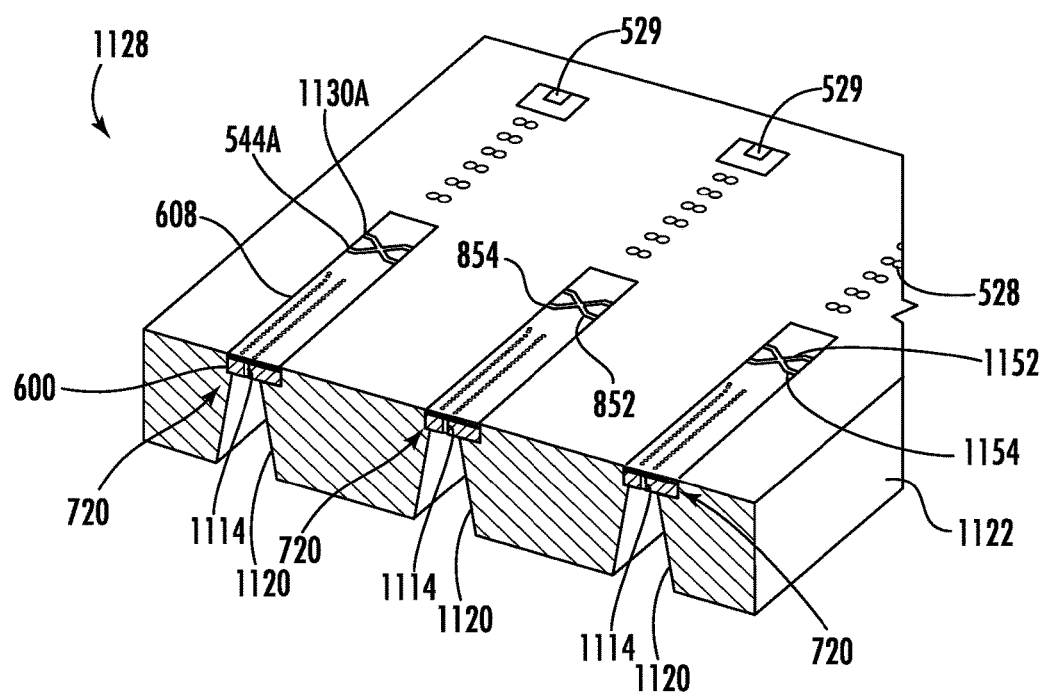
FIG. 18 is an isometric sectional view of the multi-circuit die unit of FIG. 17 after removal from the mold.

FIG. 17 is a sectional view illustrating an example method for filling recesses 544A (and recesses 744) of multiple circuit dies 720 while also partially encapsulating such circuit dies 720 to connect and retain the individual circuit dies 720 relative to one another and form the single multi-circuit die unit 1128 shown in FIG. 18. In the example illustrated, each of dies 720 is adhered facedown to a carrier tape which is carried by a carrier 1102. The carrier itself is supported on a lower mold chase 1104. The carrier tape 1100 covers and protects orifices 612 and recesses 544, 744 shown in FIGS. 10 and 11. An upper mold chase 1106 having a release liner 1108 is positioned against a backside of each of circuit dies 720. The upper mold chase 1106 and release liner 808 comprises fingers 1112 that extend into contact with a back side or face of each of dies 720, covering fluid feed passages 1114 that extend through substrate 600 and that are connected to the ejection chambers formed between layers 602 and 608 by layer 604. The shape of the fingers 1112 themselves form fluid feed slots 1120 (shown in FIG. 13).

Once lower mold chase 1104 and upper mold chase 1106 are brought into the position shown in FIG. 17, a liquid or fluid fill material 1122, such as an epoxy mold compound is supplied into the volume between mold chases 1104, 1106. The fill material, as a fluid or liquid, has a viscosity such that flows into recess 544A, at least partially filling recess 544A. In like manner, the fill material 1122 also flows into recess 744A (shown in FIG. 11). In some implementations, the fill material flows through and across such recesses from one of sides 546, 547 to the other of sides 546, 547. Once a sufficient amount of fill material has filled such recesses 544A and 744, the fill material is solidified through evaporation and/or curing. Thereafter, mold chases 1104, 1106 are separated and withdrawn, leaving the multi-circuit die unit 1128 in the form of a printhead as shown in FIG. 18.

Figure 19:
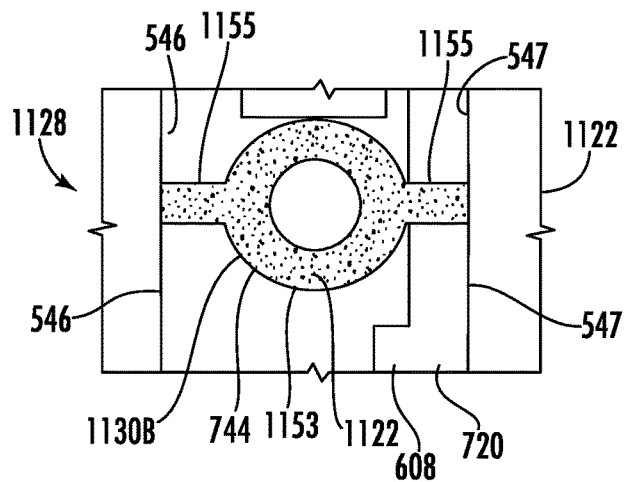
FIG. 19 is a top view of a portion of the multi-circuit die unit of FIG. 17.

Multi-circuit die unit 1128 comprises three parallel circuit dies 520. As shown by FIG. 18 and FIG. 19, the fill material 1122, an epoxy mold compound in one implementation, partially overlaps the backside of each die 720 and extends along the sides of each die 520. The fill material 1122 further extends within recess 544A and within recess 744 (shown in FIG. 14) across die 720 from edge 546 to edge 547. The fill material or filler 1122 provides an optical contrast with respect to the surrounding portions of layer 608 to form alignment target 830A (shown in FIG. 18) and alignment target 11306 (shown in FIG. 19). The fill material further forms the body which forms slot 1120 for each of dies 720. In the example illustrated, the fill material 1122 further extends across spaces between electrical contact pads 528 and about axial ends of dies 720 so as to extend along the bottom face, all four sides and partially across the top face of each of circuit dies 720.

The formed alignment targets 1130A each have a shape defined by the shape of recesses 544A. Each of alignment target 1130A has a crisscross or X shape 1152 and extensions 1154 extending from the centered X to the edges of the respective circuit die 720. The formed alignment targets 1130B (one of which is shown in FIG. 19) each have a shape defined by the shape of recesses 744 (shown in FIG. 11). Each of alignment targets 11306 has a ring shape 1153 (circular or polygonal) and extensions 1155 that extend from the ring to the opposite edges 546 and 547 of dies 720. As discussed above with respect to recesses 544A and 744, the X or ring of alignment targets 1130A and 1130B, respectively, each have a width of at least 50% of the width of circuit die 720. In other implementations, depending upon the capabilities of the sensor that detects such alignment targets, the expanse or size of such alignment targets may be reduced.

Figure 20:
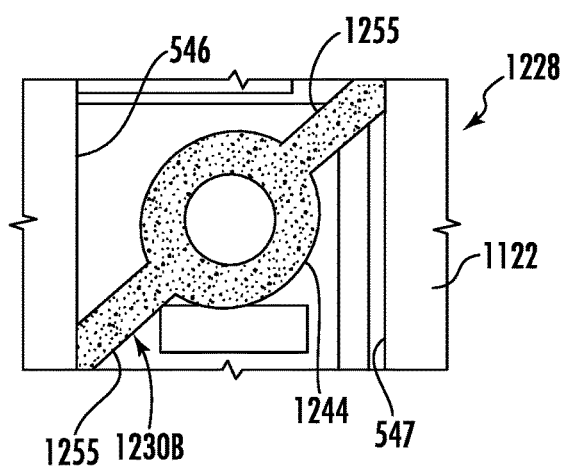
FIG. 20 is a top view of a portion of an example multi-circuit die unit.

FIG. 20 illustrates a portion of multi-circuit die unit 1228. Multi-circuit die unit 1228 is similar to multi-circuit die unit 1128 except that multi-circuit die unit 1228 comprises recess 1244 which defines an alignment target 1230B in place of alignment target 1130B. Alignment target 1230B is similar to alignment target 1130B except that alignment target 1230B comprises extensions 1255 that are oblique to sides 546 and 547. Those remaining structures are elements of multi-circuit die 1228 which correspond to elements of multi-circuit die unit 1128 are numbered similarly or are shown in FIGS. 9—and 17-18.

Figure 21:
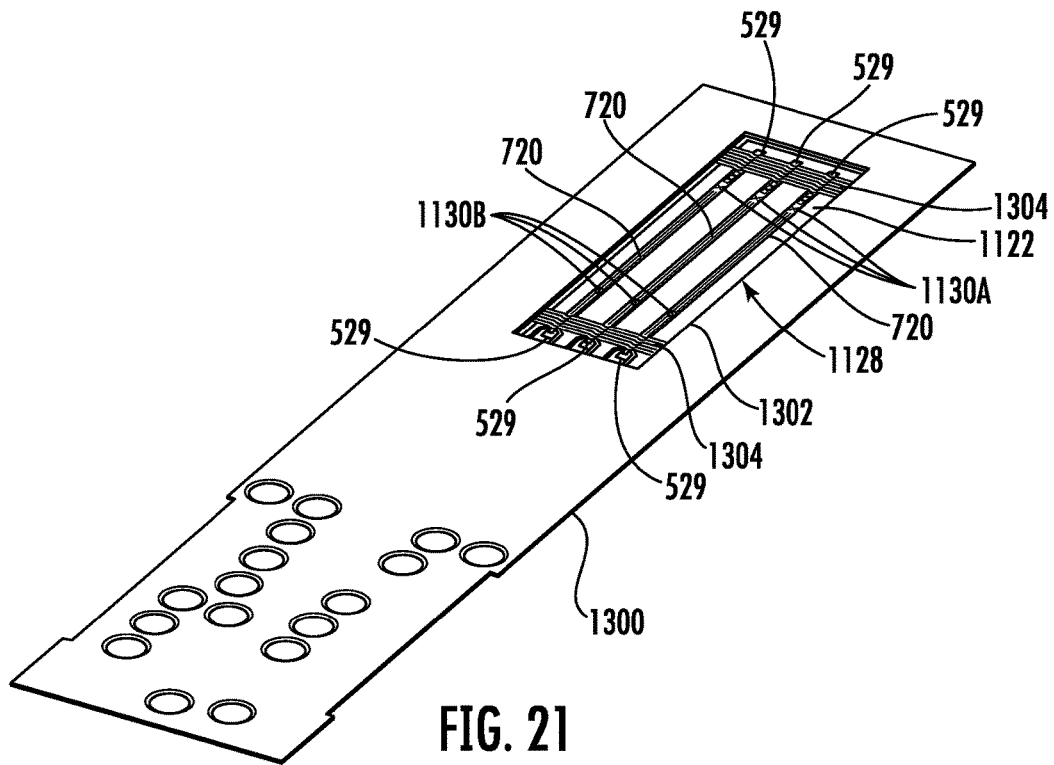
FIG. 21 is a perspective view illustrating connection of the example multi-circuit die unit of FIG. 18 to an example electrical interconnect.
Figure 22:
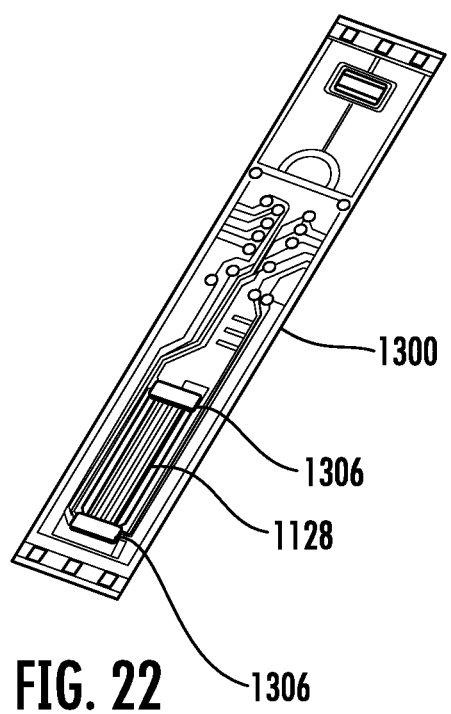
FIG. 22 is a perspective view illustrating the example electrical interconnect connected to the multi-circuit die unit following encapsulation of electrical contact pads of the multi-circuit die unit.

FIGS. 21 and 22 illustrate an example method for connecting the multi-circuit die unit 1128 to a flexible interconnect 1300. As shown by FIG. 21, alignment targets 529 and/or alignment targets 1130 may be sensed and utilized to locate multi-circuit die unit 1128 relative to an opening 1302 formed in flexible interconnect 1300. Thereafter, electrically conductive traces of flexible interconnect 1300 may be electrically connected to the electrical contact pads 528 (shown in FIG. 9) by forming electrical connectors 1304 which may be soldered or formed electrical wires or traces. As shown by FIG. 22, once connections are made between flexible interconnect 1300 and pads 528, the connections are protected through the deposition of a layer of encapsulant 1306 which encapsulates the connections between electrical contact pads 528 and connectors 1304. In one such implementation, the encapsulant 1306 not only covers the electrical contact pads 528, but also covers alignment targets 529, inhibiting or preventing subsequent use of alignment targets 529 for alignment purposes.

Figure 23:
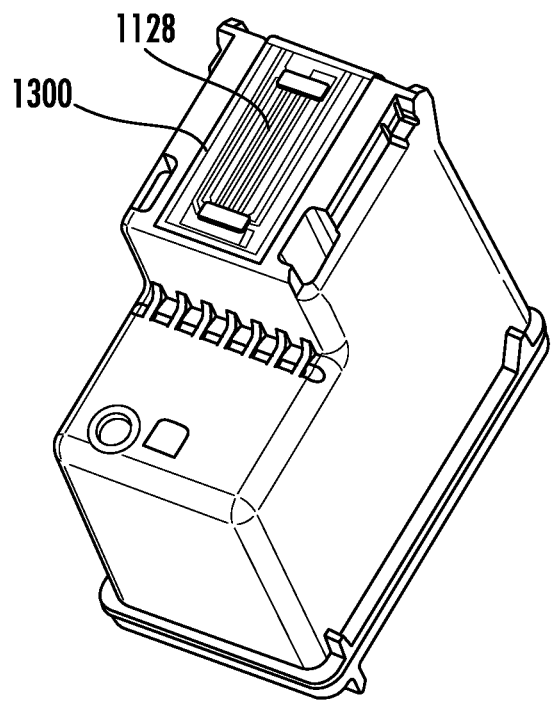
FIG. 23 is a perspective view illustrating the electrical interconnect and multi-circuit die unit of FIG. 22 mounted to an example cartridge.
Figure 24:
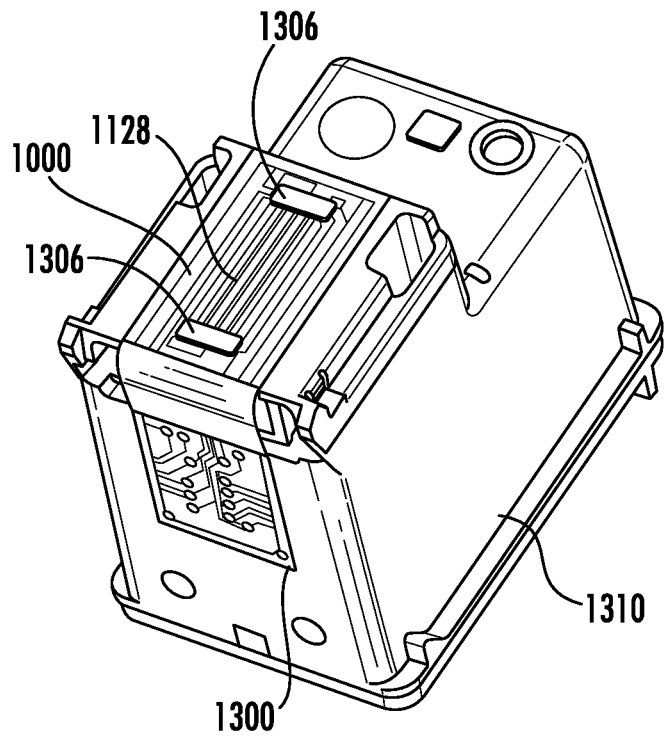
FIG. 24 is another perspective view illustrating the electrical interconnect and multi-circuit die unit of FIG. 22 mounted to the example cartridge.

FIGS. 23 and 24 illustrate an example method of mounting and securing the flexible interconnect 1300 and the supported connected multi-circuit die unit 1128 to an assembly component in the form of a cartridge 1310. Cartridge 1310 may provide a reservoir for containing at least one fluid which is to be supplied through slots 1120 (shown in FIG. 18) and through fluid passages 1114 to fluid ejection chambers that are opposite to nozzle orifices 612 (shown in FIGS. 10 and 11).

During assembly of interconnect 1300 and the supported multi-circuit die unit 1128 to cartridge 1310, alignment targets 1130A and 1130B may be sensed by an external sensor, such as optical sensor 202 (described above with respect to FIG. 3). A controller, such as controller 206 described above with respect to FIG. 3, may output control signals based upon signals from the optical sensor to align and position multi-circuit die unit 1128 and fluid supply openings within cartridge 1310 with respect to one another. Because of the relatively large size of alignment targets 1130 relative to the size of the individual circuit die 720, alignment targets 1130 facilitate more accurate positioning and alignment of multi-circuit die unit 1128 and cartridge 1310. In some implementations, the larger size of alignment target 1130 may further facilitate the use of lower-cost external sensors, such as optical sensor 202 described above.

Although multi-circuit die unit 1128 is illustrated as comprising three circuit dies 720, in other implementations, unit 1128 may comprise two circuit dies 720 or greater than three circuit dies 720. Although cartridge 1310 is illustrated as being connected to an interconnect 1300 that is connected to a multi-circuit die unit 1128 having multiple circuit dies 720, in other implementations, interconnect 1300 may be connected to a single circuit die 720 partially encapsulated in a body of filler 1122.

In those implementations where interconnect 1300 is connected to a multi-circuit die unit having at least two circuit dies partial encapsulated by filler 1122, some of the circuit dies may omit alignment targets 1130 while at least one of the circuit dies has at least one alignment target 1130, wherein the at least one alignment target 1130 of one of the circuit dies is used to align the circuit die unit 1128 respect to interconnect 1300. For example, in one implementation, two of the three circuit dies 720 shown in FIG. 21 may omit alignment targets 1130, wherein the alignment targets 1130 of the remaining circuit die may be used to position unit 1128. In one implementation, at least one of the circuit dies 720 may comprise a single alignment target 1130 rather than two alignment targets, wherein alignment is carried out using a first alignment target 1130 on a first one of the dies 720 and a second the alignment target 830 on a second one of the dies 720. In still other implementations, a single alignment target 1130 on a single die 720 may provide alignment for the multi-circuit die unit 1128.

Although the present disclosure has been described with reference to example implementations, workers skilled in the art will recognize that changes may be made in form and detail without departing from the scope of the claimed subject matter. For example, although different example implementations may have been described as including features providing benefits, it is contemplated that the described features may be interchanged with one another or alternatively be combined with one another in the described example implementations or in other alternative implementations. Because the technology of the present disclosure is relatively complex, not all changes in the technology are foreseeable. The present disclosure described with reference to the example implementations and set forth in the following claims is manifestly intended to be as broad as possible. For example, unless specifically otherwise noted, the claims reciting a single particular element also encompass a plurality of such particular elements. The terms "first", "second", "third" and so on in the claims merely distinguish different elements and, unless otherwise stated, are not to be specifically associated with a particular order or particular numbering of elements in the disclosure.

What is claimed is:

1. A circuit die assembly comprising:
a circuit die comprising:
an outermost circuit layer having electrical transmission routings;
a first alignment target overlying the outermost circuit layer;
a second alignment target formed at or below the outermost circuit layer;
a bond pad region, wherein the second alignment target is within the bond pad region; and
an encapsulant covering the second alignment target while the first alignment target remains uncovered by the encapsulant.

2. The circuit die assembly of claim 1, wherein the circuit die has a first width and wherein the first alignment target has a second width of at least 50 percent of the first width.

3. The circuit die assembly of claim 1 further comprising a non-circuit layer overlying the outermost circuit layer, the non-circuit layer having a recess, wherein the first alignment target is within the recess.

4. The circuit die assembly of claim 3, wherein the recess comprises a channel extending from a first mouth to a second mouth and wherein the first alignment target extends within the channel from the mouth to the second mouth.

5. The circuit die assembly of claim 4 further comprising a molding in which the circuit die is at least partially embedded, the molding abutting the first side and the second side of the circuit die, wherein the molding and the first alignment target are formed from a same material.

6. The circuit die assembly of claim 5, wherein the non-circuit layer comprises SU8 and wherein the same material comprises an epoxy mold compound.

7. The circuit die assembly of claim 6, wherein the non-circuit layer comprises columns of orifices through which fluid is to be ejected.

8. The circuit die assembly of claim 1, wherein the first alignment target has a shape selected from a group of shapes consisting of a ring, a U-shape and an x-shape.

9. A circuit assembly fabrication method comprising:
forming a first alignment target that overlies an outermost circuit layer of a circuit die, wherein forming the first alignment target comprises:
forming a recess in a non-circuit layer formed from a first material and overlying the outermost circuit layer of the circuit die; and
at least partially filling the recess with a second material different than the first material;
forming a second alignment target formed at or below the outermost circuit layer;
sensing light interaction with the first or the second alignment target; and
determining a position of the circuit die based upon the sensed light interaction.

10. The circuit assembly fabrication method of claim 9, wherein the second material comprises a molding material, and wherein at least partially filling the recess with the molding material comprises:
supplying the molding material along at least one side of the circuit die;
flowing the molding material, while in a liquid state, through the recess formed in the non-circuit layer overlying the outermost circuit layer to at least partially fill the recess with the molding material; and
solidifying the molding material within the channel, wherein the solidified material within the channel forms the alignment target.

11. A fluid cartridge comprising:
a housing;
a fluid ejection die coupled to the housing, the fluid ejection die comprising:
an outermost circuit layer having electrical transmission routings;
a first alignment target overlying the outermost circuit layer; and
a second alignment target formed at or below the outermost circuit layer; and
a molding coupled to the housing, wherein the fluid ejection die is at least partially embedded in the molding, and wherein a material of the molding at least partially fills a groove in a face of the fluid ejection die to form the first alignment target.

* * * * *